(12) United States Patent
Tummidi

(10) Patent No.: US 10,877,229 B2
(45) Date of Patent: Dec. 29, 2020

(54) EDGE COUPLING THROUGH UNETCHED SURFACE OF PHOTONIC CHIP

(71) Applicant: Cisco Technology, Inc., San Jose, CA (US)

(72) Inventor: Ravi S. Tummidi, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/421,801

(22) Filed: May 24, 2019

(65) Prior Publication Data

US 2020/0264391 A1 Aug. 20, 2020

Related U.S. Application Data

(60) Provisional application No. 62/807,179, filed on Feb. 18, 2019.

(51) Int. Cl.
*G02B 6/42* (2006.01)
*B23K 26/38* (2014.01)

(52) U.S. Cl.
CPC ........... *G02B 6/424* (2013.01); *G02B 6/4203* (2013.01); *B23K 26/38* (2013.01)

(58) Field of Classification Search
CPC ....... G02B 6/424; G02B 6/4203; B23K 26/38
See application file for complete search history.

(56) References Cited

U.S. PATENT DOCUMENTS

| 9,164,235 | B1 | 10/2015 | Tummidi et al. |
| 9,274,275 | B2 | 3/2016 | Webster et al. |
| 9,459,177 | B1* | 10/2016 | Dong ..................... G01M 11/30 |
| 9,618,699 | B2 | 4/2017 | Tummidi et al. |
| 9,651,739 | B2 | 5/2017 | Webster et al. |
| 9,864,133 | B2 | 1/2018 | Patel et al. |
| 9,933,566 | B2 | 4/2018 | Patel et al. |
| 10,054,745 | B2 | 8/2018 | Webster et al. |
| 10,145,758 | B2 | 12/2018 | Traverso et al. |
| 2012/0093456 | A1 | 4/2012 | Taillaert et al. |
| 2018/0313718 | A1* | 11/2018 | Traverso ................ G02B 6/305 |

OTHER PUBLICATIONS

PCT Notification of Transmittal of the Internatinoal Search Report and the Written Opinion of the International Searching Authority, or the Declaration for Application No. PCT/US2020/018477 dated May 12, 2020.

* cited by examiner

*Primary Examiner* — John Bedtelyon
(74) *Attorney, Agent, or Firm* — Patterson + Sheridan, LLP

(57) ABSTRACT

Aspects disclosed herein include providing a photonic chip that includes an unetched side surface formed by a dicing process performed on a semiconductor wafer, and a first edge coupler that is optically exposed at the unetched side surface. The photonic chip is optically aligned with an external light-carrying medium. The first edge coupler is optically coupled with the external light-carrying medium through the unetched side surface.

20 Claims, 9 Drawing Sheets

EDGE COUPLING THROUGH UNETCHED SURFACE OF PHOTONIC CHIP

CROSS-REFERENCE TO RELATED APPLICATION

This application claims domestic benefit to U.S. provisional patent application 62/807,179, filed Feb. 18, 2019 and entitled "EDGE COUPLING THROUGH UNETCHED SURFACE OF PHOTONIC CHIP". The disclosure of the US provisional patent application is herein incorporated by reference in its entirety.

TECHNICAL FIELD

Embodiments presented in this disclosure generally relate to photonic devices, and more specifically, to fabricating photonic devices with edge couplers.

BACKGROUND

Photonic chips can include optical interfaces to permit optical signals to be received from an optical source (e.g., a laser or an optical fiber) and/or transmitted to an optical fiber or detector. Some photonic chips include grating couplers disposed at the top of the photonic chip. However, grating couplers can be complicated to manufacture (e.g., requiring grayscale lithography), increasing the cost of the photonic chip and/or reducing the manufacturing yield. Other photonic chips include edge couplers, which can be disposed at the sides of the photonic chip and are easier to manufacture and can provide wavelength independent and improved optical coupling over grating couplers.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
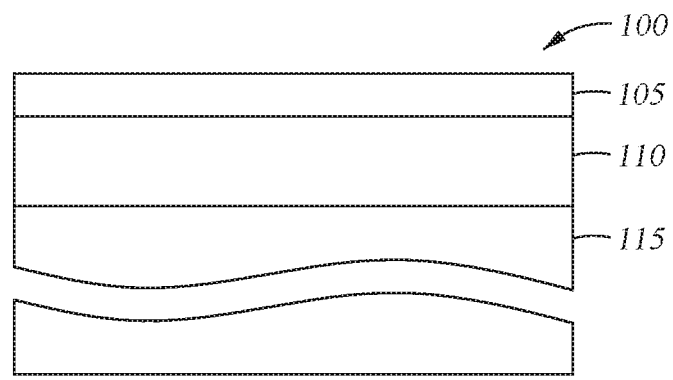
FIG. 1 illustrates a silicon on insulator (SOI) device according to one or more embodiments.

One embodiment is a method comprising providing a photonic chip comprising an unetched side surface formed by a dicing process performed on a semiconductor wafer, and a first edge coupler that is optically exposed at the unetched side surface. The method further comprises optically aligning the photonic chip with an external light-carrying medium. The first edge coupler is optically coupled with the external light-carrying medium through the unetched side surface.

Another embodiment is an optical apparatus comprising a photonic chip comprising an unetched side surface formed by a dicing process performed on a semiconductor wafer, and a first edge coupler that is optically exposed at the unetched side surface. The optical apparatus further comprises an external light-carrying medium in a fixed arrangement with the photonic chip. The first edge coupler is optically coupled with the external light-carrying medium through the unetched side surface.

Another embodiment is a method comprising performing a dicing process on a semiconductor wafer to produce a plurality of photonic chips, wherein each photonic chip of the plurality of photonic chips comprises a respective edge coupler that is optically exposed at an unetched side surface formed by the dicing process. The method further comprises optically aligning a first photonic chip of the plurality of photonic chips with an external light-carrying medium. A first edge coupler of the first photonic chip is optically coupled with the external light-carrying medium through the respective unetched side surface.

Example Embodiments

Embodiments herein describe techniques for fabricating an optical apparatus having a photonic chip. In some embodiments, a semiconductor wafer is processed to form multiple photonic chips (e.g., 20-200 chips) integrated into the semiconductor wafer. Testing structures may be formed in the semiconductor wafer to test optical and/or electro-optic components (e.g., modulators, detectors, waveguides, etc.) during their formation. In some embodiments, a testing structure is arranged proximate to an edge coupler of a photonic chip. The testing structure may be formed in a sacrificial region of the semiconductor wafer that is separated when the semiconductor wafer is diced to produce a plurality of individual photonic chips. Alternately, the testing structure for a particular photonic chip may be formed in an adjacent photonic chip.

In one embodiment, the testing structure has a grating coupler disposed at, or near, a top surface of the semiconductor wafer, which permits optical signals to be transmitted into and/or received from an optical probe when aligned with the grating coupler. The testing structure can also include an edge coupler that is optically coupled to the grating coupler as well as an edge coupler in the photonic chip. Thus, optical signals can be transmitted from the optical probe into the grating coupler, from the grating coupler to the edge coupler in the testing structure, and from the edge coupler in the testing structure to the edge coupler in the photonic chip. Conversely, optical signals can be transmitted from the edge coupler in the photonic chip to the edge coupler and the grating coupler in the testing structure and then into the optical probe. In this manner, optical components in the photonic chip can be tested using an edge coupler even while the photonic chip is integrated into a wafer.

Once testing is completed using the testing structure, the semiconductor wafer is diced to separate the plurality of photonic chips into individual photonic chips. After dicing, the edge coupler is optically exposed at a side surface (or edge) of the photonic chip that is perpendicular (or substantially perpendicular) to the top surface of the semiconductor wafer. Once separated, the edge coupler of the photonic chip can then be optically aligned with an external light-carrying medium (e.g., an optical fiber or laser) which may be used for normal operation.

Conventional techniques for edge coupling in silicon photonics require creating a mirror finish interface (or facet) at the side surface of the photonic chip. Creating the mirror finish interface typically includes performing an interlayer dielectric (ILD) etch and a deep reactive ion etch (DRIE) in a volume manufacturing process. These etch processes are often performed in a complementary metal-oxide-semiconductor (CMOS) or microelectromechanical systems (MEMS) foundry, and may be the most limiting steps of the fabrication process for the optical apparatus, being both costly and time consuming. Additionally, some edge coupling techniques may include microoptic lenses or other optical elements to achieve suitable coupling efficiency. The microoptic lenses are considered precision piece parts and require specialized equipment for placement and alignment, which adds to the cost and time expenses.

According to one embodiment, a method comprises performing a dicing process on a semiconductor wafer to produce a plurality of photonic chips. Each photonic chip of the plurality of photonic chips comprises a respective edge coupler that is optically exposed at an unetched side surface formed by the dicing process. The method further comprises optically aligning a first photonic chip of the plurality of photonic chips with an external light-carrying medium. A first edge coupler of the first photonic chip is optically coupled with the external light-carrying medium through the respective unetched side surface.

In some embodiments, the dicing process comprises one or more of mechanical sawing, scribing and cleaving, and laser cutting. The dicing process corresponds to a relatively rough kerf, which results in a chipped interface formed at the unetched side surface. Further, the saw blade placement on the semiconductor wafer when dicing has a tolerance that is typically on the order of a couple of tens of microns. The combination of the chipped interface and the saw blade tolerance is conventionally believed to result in too great a variance in the numerical aperture (NA) of the optical mode at the interface, and thus too great a variance in coupling efficiency, to be practical to implement in edge coupling schemes.

However, in some embodiments, the edge coupler of the photonic chip is configured to increase a diameter of an optical mode at the interface, which enables an external light-carrying medium (e.g., an optical waveguide of another photonic chip, an edge coupler of another photonic chip, a laser, a light emitting diode, an optical fiber, etc.) to be butt-coupled with the unetched side surface of the photonic chip and to communicate light directly with the photonic chip without additional focusing elements such as microoptic lenses. Further, in some embodiments, an index-matching material is applied between the unetched side surface and the external light-carrying medium, which further improves the optical coupling efficiency and suppresses reflection losses.

Beneficially, by using the edge coupler and/or the index-matching material to optically couple the edge coupler with the external light-carrying medium through the unetched side surface, a low coupling loss may be achieved without requiring ILD etch and/or DRIE processes. This significantly reduces fabrication costs and simplifies the supply chain, as the ILD etch and DRIE processes are non-standard CMOS processes that are not available in all foundries. Eliminating a need for the ILD etch and DRIE processes may further enable other integration schemes that might otherwise be difficult to achieve. For example, the edge coupler of the photonic chip may be directly butt-coupled with a fiber array unit (FAU) using an index-matching epoxy.

FIG. 1 illustrates a silicon on insulator (SOI) device 100, according to one or more embodiments. The SOI device 100 includes a surface layer 105, a buried insulation layer 110 (also referred to as buried oxide (BOX) layer), and a semiconductor substrate 115. Although the embodiments herein refer to the surface layer 105 and semiconductor substrate 115 as silicon, the disclosure is not limited to such. For example, other semiconductors or optically transmissive materials may be used to form the structure shown here. Moreover, the surface layer 105 and the semiconductor substrate 115 may be made of the same material, but in other embodiments, the surface layer 105 and the semiconductor substrate 115 are made from different materials.

The thickness of the surface layer 105 may range from less than 100 nanometers to greater than a micron. More specifically, the surface layer 105 may be between 100-300 nanometers thick. The thickness of the insulation layer 110 may vary depending on the desired application. In one embodiment, the thickness of the insulation layer 110 may range from less than one micron to tens of microns. The thickness of the semiconductor substrate 115 may vary widely depending on the specific application of the SOI device 100. For example, the semiconductor substrate 115 may be the thickness of a typical semiconductor wafer (e.g., 100-700 microns) or may be thinned and mounted on another substrate.

For optical applications, the silicon surface layer 105 and insulation layer 110 (e.g., silicon dioxide, silicon nitride, silicon oxynitride, and the like) may provide contrasting refractive indexes that confine an optical signal in a silicon waveguide in the surface layer 105. In a later processing step, the surface layer 105 may be etched to form one or more silicon waveguides. Because silicon has a higher refractive index compared to an insulator such as silicon dioxide, the optical signal remains primarily in the silicon waveguide as it propagates across the surface layer 105.

Figure 2:
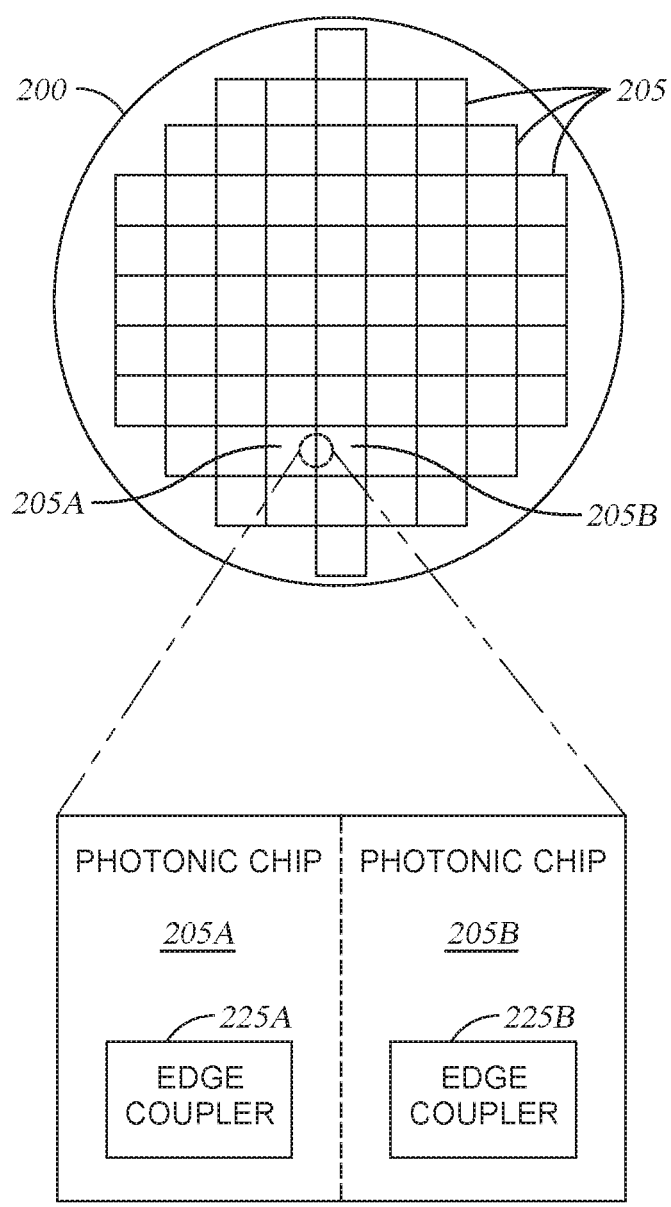
FIG. 2 illustrates a semiconductor wafer comprising photonic chips with edge couplers, according to one or more embodiments.

FIG. 2 is a top view of a semiconductor wafer 200 (or wafer 200) comprising photonic chips 205 with edge couplers, according to one or more embodiments. As shown, the semiconductor wafer 200 includes a plurality of rectangularly-shaped photonic chips 205 (e.g., from 10-200 chips).

Instead of forming a single photonic chip 205 at a time, the semiconductor wafer 200 permits the same fabrication steps to be used to form multiple photonic chips 205 in parallel.

The photonic chips 205 include the insulation layer 110 and the semiconductor substrate 115 shown in FIG. 1. However, the surface layer 105 has been processed to include various optical components (e.g., waveguides, couplers, modulators, detectors, etc.). For example, the optical components may be formed by performing various fabrication steps on the surface layer 105, such as etching or doping the silicon material of the surface layer 105, as well as depositing or growing additional materials.

In the magnified portion of the semiconductor wafer 200, adjacent photonic chips 205A, 205B of the plurality of photonic chips 205 are divided by a dashed line. That is, the semiconductor wafer 200 can be diced along the dashed line to separate the photonic chips 205A, 205B. In some embodiments, a dicing process used to dice the semiconductor wafer 200 comprises one or more of mechanical sawing, scribing and cleaving, and laser cutting.

Conventional processing of a particular photonic chip 205 (i.e., once separated by the dicing process) also includes creating a mirror finish interface (or facet) at one or more side surfaces of the photonic chip 205. The mirror finish interface enables a high optical coupling efficiency for edge coupling the photonic chip 205 with an external light-carrying medium. Creating the mirror finish interface typically includes performing ILD etch and DRIE on one or more unetched side surfaces of the photonic chip 205.

However, in various embodiments discussed herein, the photonic chip 205 is optically coupled with the external light-carrying medium through the unetched side surface (i.e., without performing ILD etch and DRIE on the unetched side surface). Beneficially, optical coupling through the unetched side surface provides a substantial cost savings and/or increases throughput during fabrication. Further, the optical coupling through the unetched side surface does not require additional optical elements (e.g., microoptic lenses) to achieve a suitable coupling efficiency, which provides further cost savings and/or increased throughput.

The adjacent photonic chips 205A, 205B each include respective edge couplers 225A, 225B that are optically exposed at an unetched side surface formed by the dicing process. The edge couplers 225A, 225B may be designed to efficiently couple to an external light-carrying medium (e.g., a semiconductor laser or optical fiber). In some embodiments, use of the edge couplers 225A, 225B mitigates the optical losses associated with transmitting optical signals through the unetched side surface.

In some embodiments, the semiconductor wafer 200 comprises testing structures for testing one or more optical components of each of the photonic chips 205 prior to performing the dicing process. As is discussed elsewhere in greater detail, the testing structures may be included in some or all of the photonic chips 205, one or more sacrificial regions, and/or in adjacent dies (e.g., neighboring photonic chips 205) that are separated from the photonic chips 205 by performing the dicing process.

Figure 3:
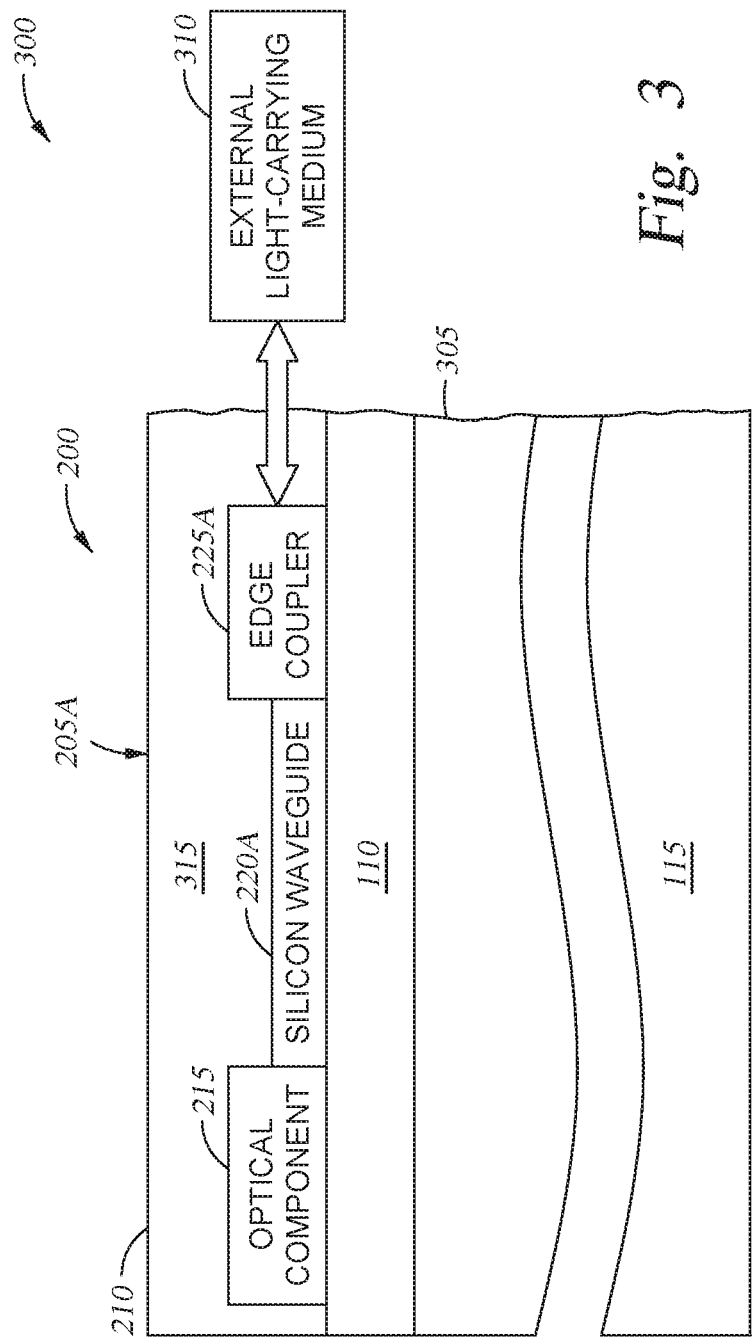
FIG. 3 illustrates a photonic chip optically coupled through an unetched side surface, according to one or more embodiments.

FIG. 3 is a diagram 300 illustrating a photonic chip 205A optically coupled through an unetched side surface 305, according to one or more embodiments. The features illustrated in the diagram 300 may be used in conjunction with other embodiments.

The photonic chip 205A comprises the insulation layer 110 and the semiconductor substrate 115. However, the surface layer 315 (e.g., including the surface layer 105 of FIG. 1) has been processed to include various optical structures. In this example, the photonic chip 205A includes an optical component 215 coupled to an edge coupler 225A via a silicon waveguide 220A. The optical component 215 may be formed by performing various fabrication steps on the silicon layer, such as etching or doping the silicon material, as well as depositing or growing additional materials. Although not shown, the optical component 215 may be electrically connected to a top surface 210 of the surface layer 315 by a conductive pad and electrical vias. For example, the optical component 215 may be an optical modulator that is controlled by electrical data signals received from an external source for controlling the modulation of optical signals. In one embodiment, the optical modulator may modulate an optical signal received from the edge coupler 225A, or alternatively, may be coupled to a laser (not shown) in the photonic chip 205 which outputs a continuous wave (CW) optical signal that is modulated by the optical modulator before being transmitted to the edge coupler 225A.

On the other hand, if the optical component 215 is an optical detector, the optical detector may have n-type and p-type doped regions coupled to respective conductive pads at the top surface 210 for receiving or transmitting electrical signals that correspond to the absorbed optical signal received from the silicon waveguide 220A.

Although not shown, after the photonic chip 205A is separated from the semiconductor wafer 200, the conductive pads at the top surface 210 may be connected to an electrical integrated circuit (IC) that receives electrical signals from, or transmits electrical signals to, the optical component 215. In one embodiment, the electrical IC is physically separate from the photonic chip 205A but couples to the top surface 210 via a bond wire and/or a bus. In another embodiment, the logic in the electrical IC is formed in the same SOI structure of the photonic chip 205A. Thus, instead of using a conductive pad, the optical component 215 can transmit and receive a data signal to the logic using an internal trace or wire.

In some embodiments, the silicon waveguide 220A is fabricated from the surface layer 105 of FIG. 1. The photonic chip 205A uses the silicon waveguide 220A to carry an optical signal to different areas of the surface layer 315. In this example, the silicon waveguide 220A transmits optical signals between the edge coupler 225A and the optical component 215.

In some embodiments, the unetched side surface 305 is formed by a dicing process performed on the semiconductor wafer 200, which comprises one or more of: mechanical sawing, scribing and cleaving, and laser cutting.

As shown, one interface of the edge coupler 225A is coupled to the silicon waveguide 220A while another interface is optically exposed at the unetched side surface 305. As used herein, "optically exposed" means the edge coupler 225A is physically exposed at the unetched side surface 305 or is slightly recessed from the unetched side surface 305 (e.g., 1-5 microns) but can nonetheless optically couple to an external light-carrying medium 310.

In one embodiment, the edge coupler 225A is made of the same material as the silicon waveguide 220A. For example, the edge coupler 225A and the silicon waveguide 220A may both be made of silicon. In one embodiment, the edge coupler 225A is formed from silicon nitride or silicon oxynitride while the silicon waveguide 220A is formed from crystalline silicon. Other materials are contemplated for the edge coupler 225A and the silicon waveguide 220A.

The edge coupler 225A may be designed to efficiently couple to an external light-carrying medium 310. Some non-limiting examples of the external light-carrying medium 310 include an optical waveguide of a second photonic chip, a second edge coupler of the second photonic chip, a laser, a light emitting diode, and an optical fiber. In one embodiment, the external light-carrying medium 310 is further coupled with a semiconductor laser that outputs a continuous wave (CW) optical signal that is received by the edge coupler 225A. In an alternate embodiment, the external light-carrying medium 310 comprises the semiconductor laser.

Because the dimensions of the silicon waveguide 220A may result in high optical losses if directly coupled to the external light-carrying medium 310 through the unetched side surface 305, the external light-carrying medium 310 may instead be coupled to the edge coupler 225A, which then transfers the signal into the silicon waveguide 220A. Doing so may eliminate the need for using lenses between the external light-carrying medium 310 and the waveguide 220A, which focus the optical signal into a mode with a diameter similar to the dimensions of the waveguide 220A. Stated differently, in one embodiment, the edge coupler 225A permits the external light-carrying medium 310 to be butt-coupled to the unetched side surface 305 of the photonic chip 205A (i.e., after the photonic chip 205A is diced) and transmit light directly into the photonic chip 205A without the addition of external focusing elements such as lenses.

In one embodiment, the edge coupler 225A is formed from at least one tapered waveguide where the width of the waveguide varies as the edge coupler 225A extends along a direction of propagation of the optical signal. As described in more detail below, the edge coupler 225A may include a plurality of stacked layers that are processed (e.g., etched) such that an optical signal received by the edge coupler 225A is focused into the silicon waveguide 220A.

Figure 4:
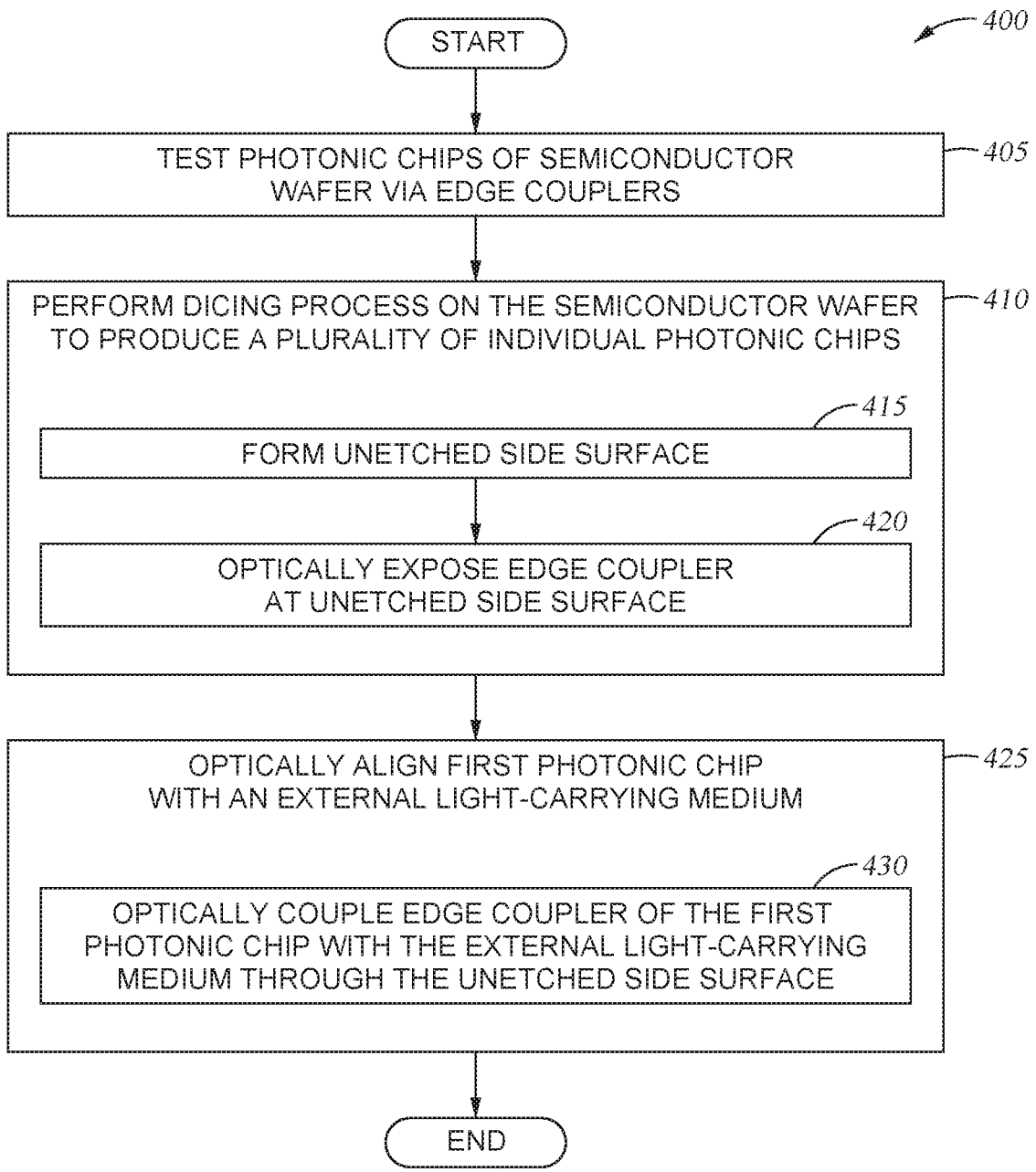
FIG. 4 is a method of fabricating an optical apparatus, according to one or more embodiments.

FIG. 4 is a method 400 of fabricating an optical apparatus, according to one or more embodiments. The method 400 may be performed in conjunction with other embodiments.

The method 400 begins at block 405, where photonic chips of a semiconductor wafer are tested via edge couplers. In some embodiments, the photonic chips include one or more testing structures that are used to test adjacent photonic chips. In some embodiments, one or more testing structures are formed in a separate region of the semiconductor wafer, such as a sacrificial region that is removed during a dicing process.

In some embodiments, testing the photonics chips is performed by a technician or a testing apparatus that moves an optical probe into optical communication with a grating coupler of the testing structure. In one embodiment, an alignment apparatus may be used to ensure the optical probe has an optimal angle relative the grating coupler, so that optical signals can be transferred through a top surface of the semiconductor wafer. In another embodiment, an alignment apparatus may be formed on the surface of the semiconductor wafer to ensure the proper angle between the optical probe and the grating coupler.

At block 410, the dicing process is performed on the semiconductor wafer to produce a plurality of individual photonic chips. In some embodiments, performing the dicing process comprises forming an unetched side surface at block 415, and optically exposing an edge coupler of the photonic chip at the unetched side surface at block 420.

At block 425, a first photonic chip of the plurality of individual photonic chips is optically aligned with an external light-carrying medium. In some embodiments, optically aligning the first photonic chip comprises optically coupling the edge coupler of the first photonic chip with the external light-carrying medium through the unetched side surface at block 430. Method 400 ends following completion of block 430.

Figure 5A:
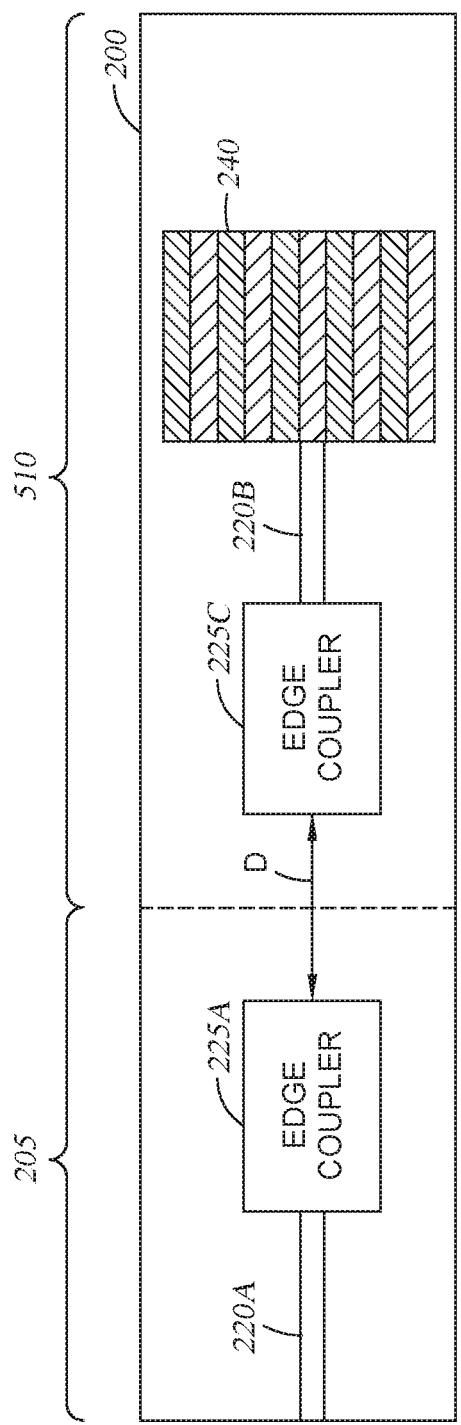
FIGS. 5A and 5B illustrate side and top views of a testing structure of a semiconductor wafer, according to one or more embodiments.
Figure 5B:
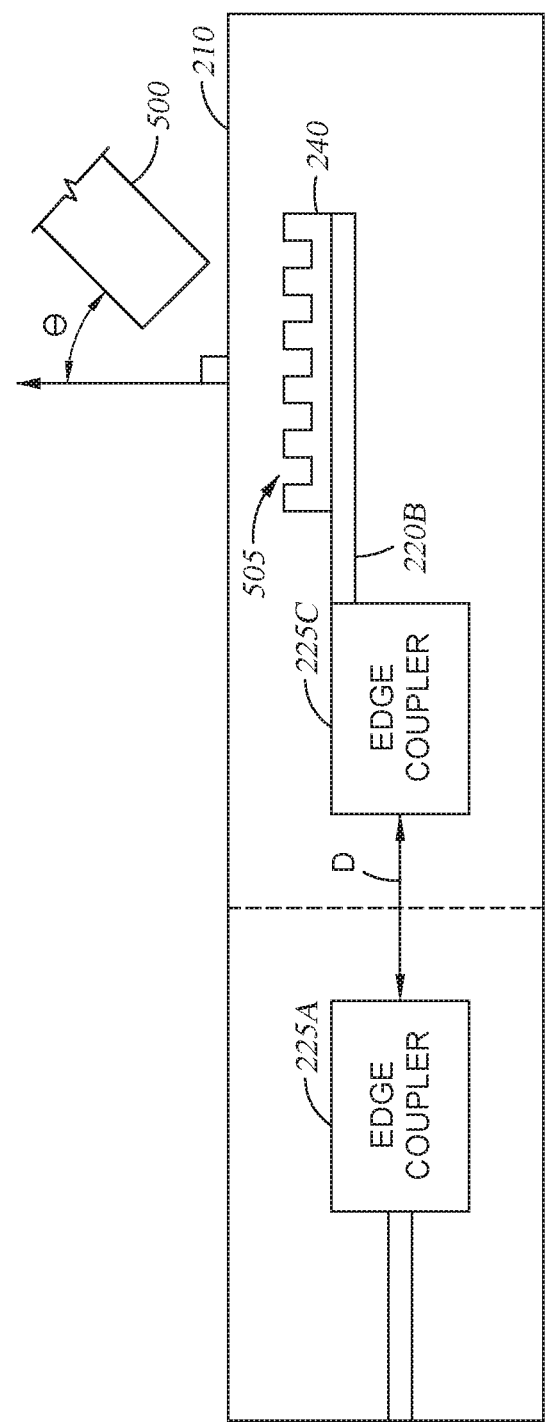

FIGS. 5A and 5B illustrate side and top views of a testing structure of a semiconductor wafer, according to one or more embodiments. More specifically, FIG. 5A illustrates a top view of the semiconductor wafer 200, while FIG. 5B illustrates a cross-sectional side view of the semiconductor wafer 200. In FIG. 5A, the testing structure 510 of the semiconductor wafer 200 comprises an edge coupler 225C, a silicon waveguide 220B, and a grating coupler 240. In some embodiments, the testing structure 510 is included in a photonic chip adjacent to the photonic chip 205. In other embodiments, the testing structure 510 is included in a sacrificial region of the semiconductor wafer 200.

For simplicity, only the edge coupler 225A and the waveguide 220A are shown in the photonic chip 205. In this example, the edge couplers 225A, 225C are separated by a distance (D). That is, the edge couplers 225A, 225C do not directly contact each other but instead are separated by a dielectric material—e.g., silicon dioxide. In one embodiment, the distance D is at least 10 microns (e.g., between 10 microns and 40 microns) and has a coupling loss of less than 0.5 dB.

Although shown as being separated, in one embodiment, the edge couplers 225A, 225C may be contacting. For example, instead of two edge couplers 225A, 225C, the semiconductor wafer 200 may include a single, elongated edge coupler that extends between the silicon waveguides 220A, 220B. The testing structure 510 may be removed from the photonic chip 205 by dicing through the middle of the elongated edge coupler (e.g., along the dashed line). The portion of the edge coupler in the photonic chip 205 (which is now optically exposed on a side surface) can then be coupled to an external light-carrying medium when packaging the photonic chip 205.

As shown in FIG. 5B, during testing, an optical probe 500 is disposed over the grating coupler 240 in order to transmit optical signals into, or receive optical signals from, the grating coupler 240. In one embodiment, the optical probe 500 is offset relative to the top surface 210 of the wafer. For example, the optical probe 500 may have an offset angle θ of twenty (20) degrees relative to a direction that is perpendicular to the plane formed by the top surface 210 of the semiconductor wafer 200. Moreover, the grating coupler 240 includes a plurality of ridges 505 that extend in a direction parallel to the top surface 210. As the light emitted by the optical probe 500 strikes the ridges 505, the light is reflected into the silicon waveguide 220B. Stated differently, the ridges 505 redirect the light into the silicon waveguide 220B. Conversely, the ridges 505 can redirect the light received from the silicon waveguide 220B up through the top surface 210 at the angle θ into the optical probe 500. Although the grating coupler 240 is shown in FIG. 5B as being recessed from the top surface 210, in another embodiment the grating coupler 240 is physically exposed at the top surface 210. Thus, the grating coupler 240 can be optically exposed at the top surface 210 by being slightly recessed from the top surface 210 or by being physically exposed at the top surface 210.

In one embodiment, when dicing the wafer, the photonic chip 205 and the testing structure 510 are separated along the dashed line shown in FIG. 5B. That is, the dashed line illustrates the location of the unetched side surface of the photonic chip 205 after the testing structure 510 has been removed using a dicing process.

Figure 6:
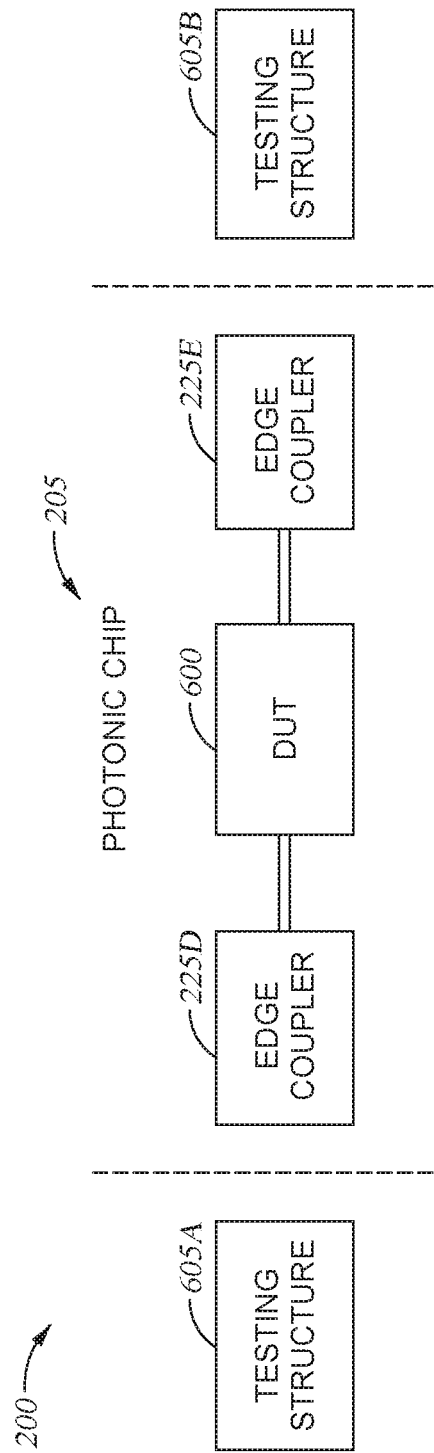
FIG. 6 illustrates a semiconductor wafer with multiple testing structures optically coupled to a photonic chip, according to one or more embodiments.

FIG. 6 illustrates a top view of the semiconductor wafer 200 with multiple testing structures 605A, 605B that are optically coupled to the photonic chip 205, according to one or more embodiments. The features of FIG. 6 may be used in conjunction with other embodiments. For example, the testing structure 510 of FIG. 5A may be implemented as testing structures 605A, 605B.

The testing structures 605A, 605B may be included in sacrificial regions of the semiconductor wafer 200, and/or photonic chips that are adjacent to the photonic chip 205. For example, the photonic chip 205 may sandwiched between two sacrificial regions. That is, the sacrificial regions are disposed at opposite sides of the photonic chip 205. However, the sacrificial regions may be disposed on any two sides of the photonic chip 205. For example, one sacrificial region can be disposed on a left side of the photonic chip 205 while another sacrificial region is disposed on the top or bottom side of the photonic chip 205. In another example, the sacrificial regions are disposed on a same side of the photonic chip 205.

Regardless of the arrangement of the sacrificial regions and/or adjacent photonic chips, the testing structures 605A, 605B form an optical path for testing a device under test (DUT) 600 in the photonic chip 205. In some cases, a technician can use a first optical probe to transmit an optical signal into the testing structure 605A which is then transferred into the edge coupler 225D and the DUT 600. The DUT 600 (e.g., an optical component) modifies the optical signal that is transmitted to the edge coupler 225E and to the testing structure 605B. The testing structure 605B can transmit the optical signal to a second optical probe. In one embodiment, the first and second optical probes are coupled to the same testing apparatus which can compare the optical signal transmitted on the first optical probe to the optical signal received on the second optical probe to determine if the DUT 600 is functioning properly. In this manner, multiple testing structures 605A, 605B can be disposed in different regions of the semiconductor wafer 200 to form an optical path through the photonic chip 205.

Figure 7:
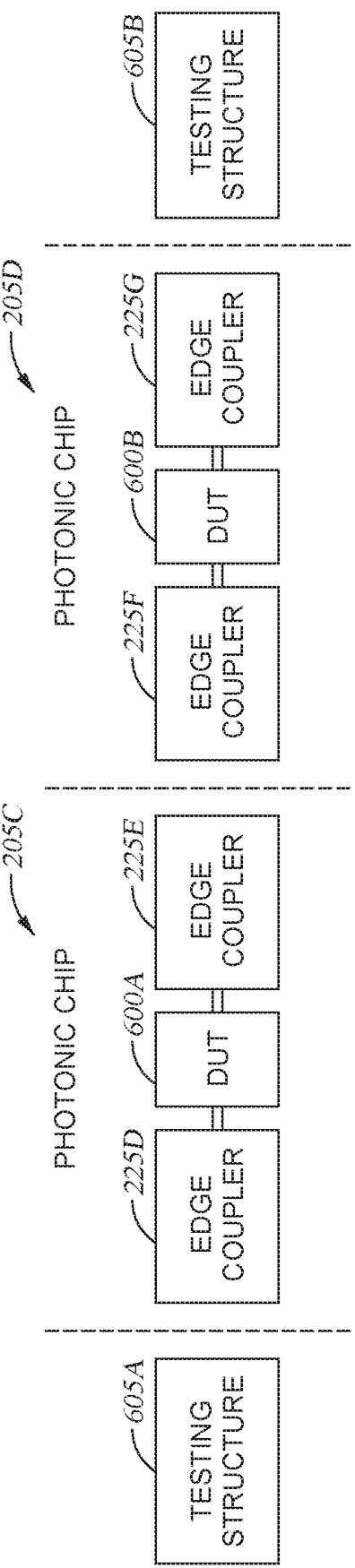
FIG. 7 illustrates a semiconductor wafer with photonic chips that are optically cascaded, according to one or more embodiments.

FIG. 7 illustrates the semiconductor wafer 200 with photonic chips 205 that are optically cascaded, according to one or more embodiments. In this example, the semiconductor wafer 200 includes two photonic chips 205C and 205D which are optically coupled using respective edge couplers 225E, 225F. That is, the edge coupler 225E in the photonic chip 205C is arranged in the wafer 200 to be optically coupled to the edge coupler 225F in the photonic chip 205D. As such, optical signals can be transferred between the photonic chips 205 while still integrated into the semiconductor wafer 200.

Figure 8:
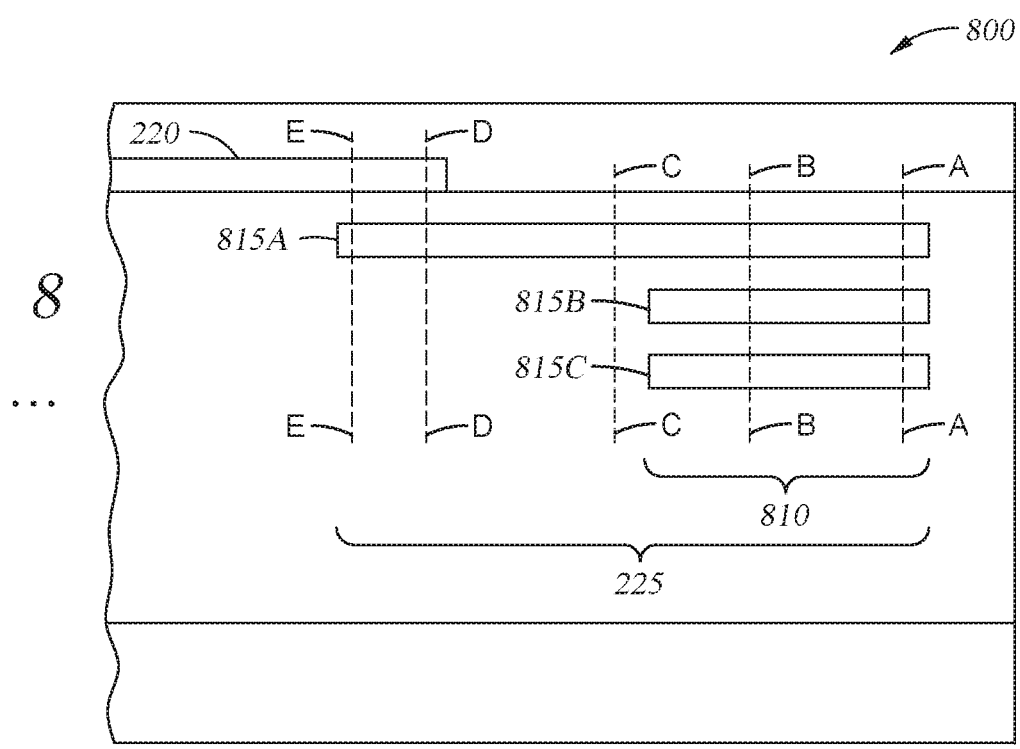
FIG. 8 illustrates an edge coupler, according to one or more embodiments.

Instead of using the testing structures 605A, 605B to test an optical component in one photonic chip 205, in FIG. 8 the testing structures 605A, 605B establish an optical path for testing optical components in multiple photonic chips 205C, 205D. As shown, the testing structure 605A is optically coupled to the edge coupler 225D in the photonic chip 205C. Thus, the technician can introduce an optical signal into the testing structure 605A which then is transmitted through the DUT 600A and into the DUT 600B in the photonic chip 205D. The output of the DUT 600B (e.g., an optical signal modified by DUT 600A and/or DUT 600B) is received at the testing structure 605B via the edge coupler 225G. As above, the optical probes used to transmit and receive the optical signals via the testing structures 605A, 605B can be coupled to a testing apparatus to determine the functionality of the photonic chips 205C, 205D.

The testing arrangement shown in FIG. 7 may be preferred since fewer sacrificial regions 230 may be needed in the semiconductor wafer 200 which means more area can be used for the photonic chips 205C, 205D. However, this arrangement may mean the technician cannot tell which of the photonic chips 205C, 205D is non-functional if the output signal is not within a predefined tolerance. Put differently, the technician may label both of the photonic chips 205C, 205D as being non-functional even though only one of the photonic chips 205C, 205D may have a defect.

Although FIG. 7 illustrates cascading two photonic chips, any number of photonic chips 205 may be interconnected between two testing structures 605A, 605B. In one example, the semiconductor wafer 200 may include testing structures 605A, 605B at the edges of the semiconductor wafer 200 rather than between the photonic chips 205. In another example, all the photonic chips 205 of a particular row or column of the semiconductor wafer 200 can be optically connected using edge couplers 225 between two testing structures 605A, 605B as shown in FIG. 7. Alternatively, photonic chips 205 of multiple rows or multiple columns may be interconnected. For example, three photonic chips 205 of a first row may be interconnected (e.g., similar to the arrangement shown in FIG. 7), but instead of the third photonic chip 205 of the first row being connected to the testing structure 605B, this photonic chip 205 is coupled using an edge coupler 225 to a photonic chip 205 in a second, neighboring row which can then be coupled to the testing structure 605B or to additional photonic chips 205 in the second row. In any case, the two photonic chips 205 at the ends of the cascade of photonic chips 205 are coupled to the testing structures 605A, 605B to form an optical path through the photonic chips 205.

FIG. 8 illustrates an edge coupler 225, according to one or more embodiments. FIG. 8 illustrates a side view 800 of a photonic chip or a testing structure that includes an edge coupler 225 formed using a multi-prong, embedded structure. Here, a silicon waveguide 220 is formed above the edge coupler 225 (e.g., the edge coupler 225 may be embedded in the insulation layer 110 illustrated in FIG. 1). However, in another embodiment, the multi-prong structure may be flipped relative to the silicon waveguide 220 such that the prongs of the edge coupler 225 are formed in layers above the silicon waveguide 220 (i.e., the silicon waveguide 220 is between the prongs of the edge coupler 225 and the insulation layer 110 of the SOI device). Although not shown, the silicon waveguide 220 couples an optical signal between one or more optical components and the edge coupler 225.

The edge coupler 225 includes a waveguide adapter 810 which can be optically coupled to another edge coupler 225 (i.e., before the semiconductor wafer has been diced) or to an external optical device (i.e., after the semiconductor wafer has been diced). The edge coupler 225 is made of separate prongs 815A, 815B, 815C that may include the same material (e.g., silicon nitride or silicon oxynitride) embedded in an insulative material (e.g., silicon dioxide or silicon oxynitride). In one embodiment, the material of the prongs 815A, 815B, 815C and the edge coupler 225 may be different from the material of the insulation layer 110 shown in FIG. 1. Generally, the edge coupler 225 may be made of any material with a higher refractive index than the material of the insulative material surrounding the prongs 815A, 815B, 815C.

Figure 9A:
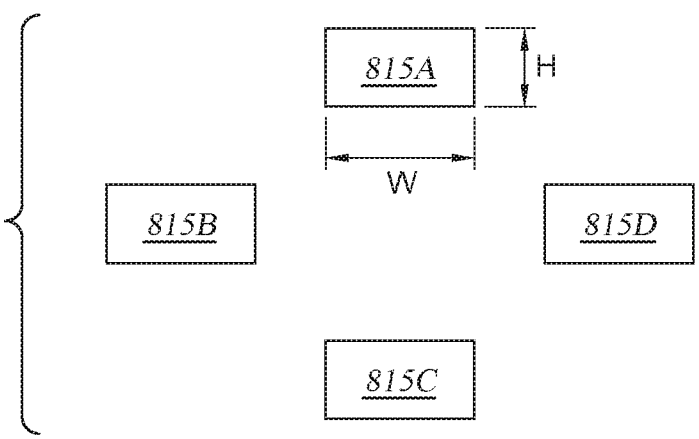
FIGS. 9A-9E illustrates different cross-sectional views of the edge coupler of FIG. 8, according to one or more embodiments.

FIGS. 9A-9E illustrate cross-sectional views of the edge coupler of FIG. 8, according to one or more embodiments. Specifically, FIG. 9A illustrates the cross section A-A of a portion of the waveguide adapter 810 that is closest to a neighboring edge coupler (or a coupling interface if the semiconductor wafer has already been diced). Here, the waveguide adapter 810 includes four separate prongs 815A, 815B, 815C, 815D that may have the same or similar width (W) and height (H) (or thickness) dimensions. These dimensions, as well as the spacing between the prongs 815A, 815B, 815C, 815D may vary depending on the specific application. In the example shown, the waveguide adapter 810 may be configured to interface with a single mode optical fiber with a 10 micron mode field diameter. As will be appreciated by one of ordinary skill in the art, these dimensions may vary depending on the specific application. Specifically, the dimensions may be chosen such that the mode of the prong at the coupling interface substantially matches the mode of the external device to which light is to be coupled to or from. As described herein, "substantially matches" includes a case in which the mode sizes are equal, as well as cases in which the mode sizes are within about 25% of each other. Here, the width of the prongs 815A, 815B, 815C, 815D may range from approximately 200-300 nanometers with a height between 100-250 nanometers. More specifically, the width may be around 200 nanometers while the height is approximately 200 nanometers. The distance between prong 815A and prong 815C and the distance between prong 815D and prong 815B may be around two microns. As mentioned above, the dimensions, as well as the spacing, of the prongs 815A, 815B, 815C, 815D may vary according to the mode or design of the external light source coupled to the photonic chip.

Figure 9B:
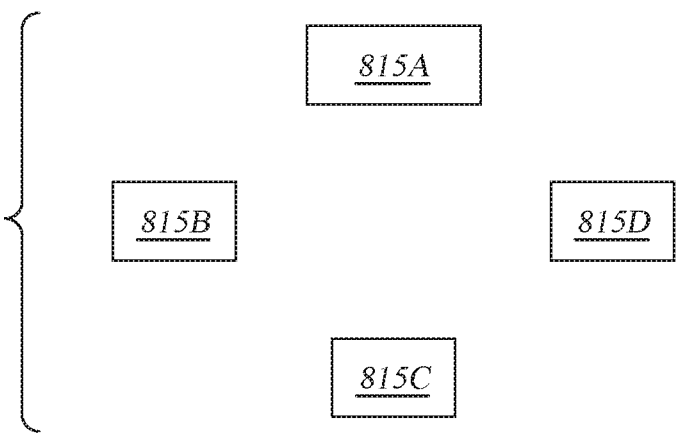

FIG. 9B illustrates the cross section B-B of the waveguide adapter 810. This figure shows that as the multi-prong adapter is recessed away from the neighboring edge coupler, the width of the prongs 815B, 815C, 815D reduces while the width of prong 815A increases. As shown, the tapering of widths of the prongs 815A, 815B, 815C, 815D is done in an adiabatic fashion. The tapering results in a gradual transition of optical energy from an optical mode which is confined by the prongs 815A, 815B, 815C, 815D at the right side of the waveguide adapter 810 where the widths and heights of the prongs 815A, 815B, 815C, 815D are same or similar to a mode which is gradually confined more and more in the upper prong 815A at positions farther to the left in the waveguide adapter 810. This tapering transfers the optical energy confined by prongs 815A, 815B, 815C, 815D to prong 815A alone. However, the opposite is also true. That is, tapering the widths also enables a signal introduced in the upper prong 815A to be transferred to a mode confined by prongs 815A, 815B, 815C, 815D as the optical signal propagates from left to right. The widths of the prongs 815A, 815B, 815C, 815D may change continuously (e.g., a linear or non-linear fashion such as exponentially or at higher order polynomial profiles) or, in an alternate embodiment, at discrete increments as the waveguide adapter 810 extends from right to left. As shown in FIG. 8, eventually the prongs 815B, 815C, 815D terminate (which ends the waveguide adapter 810) while prong 815A continues to transmit the optical signal. In one embodiment, the waveguide adapter 810 may have a length of approximately 100 to 500 microns. Furthermore, the waveguide adapter 810 may taper for all of this length or for only a portion thereof. For example, the widths of the prongs 815A, 815B, 815C, 815D may remain substantially equivalent for the first five to fifty microns before the widths of prongs 815A, 815B, 815C, 815D begin to change.

Figure 9C:
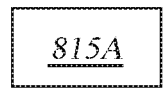

FIG. 9C illustrates the cross section C-C of the edge coupler 225. Here, the waveguide adapter 810 has terminated which leaves the prong 815A to carry the optical signal. Although shown as being linear, the prong 815A may bend or twist to carry the optical signal to different areas of the photonic chip or testing structure. Thus, the length of the prong 815A may be much larger than the lengths of prongs 815B, 815C, 815D to enable the prong 815A to carry an optical signal to different areas.

Figure 9D:
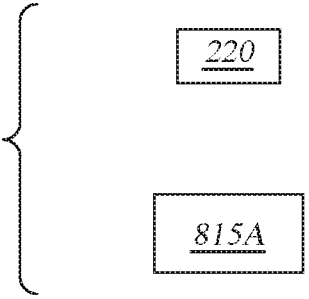

FIG. 9D illustrates the cross section D-D of the edge coupler 225 and the silicon waveguide 220. As shown, the width of the prong 815A is larger than the width of the silicon waveguide 220. Moreover, the distance between the prong 815A and the silicon waveguide 220 may range from hundreds of nanometers to only a few nanometers depending on the techniques used to fabricate the wafer. Depending on the technique used to fabricate the semiconductor wafer, a portion of the prong 815A may directly contact the silicon waveguide 220.

Figure 9E:
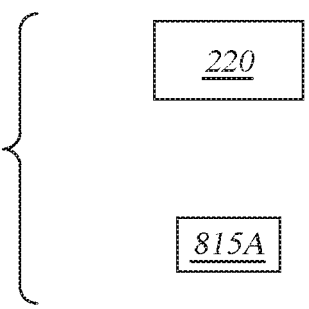

FIG. 9E illustrates the cross section E-E of the edge coupler 225 and the silicon waveguide 220. Here, the width of the prong 815A has shrunk while the width of the silicon waveguide 220 has increased. This tapering, which is again shown in an adiabatic fashion, results in the optical signal in the prong 815A to transfer to the silicon waveguide 220 and vice versa with minimal loss. Eventually, the prong 815A terminates and the silicon waveguide 220 may carry the optical signal to different optical components, e.g., optical components in the photonic chip or a grating coupler in the testing structure.

Although the embodiments above discuss tapering the prongs 815A, 815B, 815C, 815D by changing the width, a similar transfer of optical power may occur if the heights are tapered, or some combination of both. However, tapering the height of the prongs 815A, 815B, 815C, 815D may require different lithography and fabrication techniques or materials than tapering the widths as shown in FIGS. 9A-9E. It is also not necessary that the widths of all the prongs are tapered. For example, in certain designs the required transfer of optical energy can be obtained by just tapering the width of 815A alone while the widths of prongs 815B, 815C, 815D are not tapered.

Figure 10A:
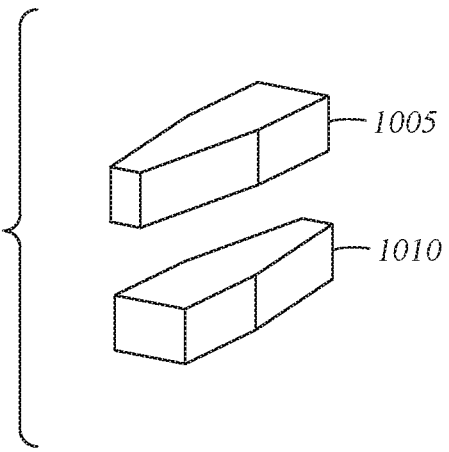
FIGS. 10A and 10B illustrate a tapered waveguide, according to one or more embodiments.
Figure 10B:
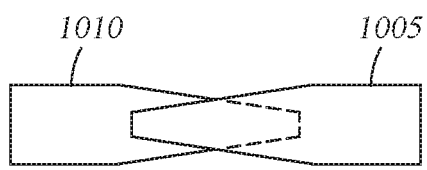

FIGS. 10A and 10B illustrate views of a tapered waveguide, according to one or more embodiments. More specifically, FIGS. 10A and 10B illustrate a partially overlapping, inverse-taper waveguide structure for transferring an optical signal between waveguides. As shown, FIG. 10A illustrates a plan view of a first tapered waveguide 1005 partially overlapping a second tapered waveguide 1010. Specifically, FIG. 10A may be the arrangement of the portion of a photonic chip or testing structure in FIG. 8 where waveguide 220 overlaps the prong 815A. The tapering of the waveguides is done adiabatically to minimize optical loss. Although FIGS. 10A and 10B illustrate that the widths of the tapers vary linearly, the waveguides can also taper in a non-linear fashion, for example, exponential or some higher-order polynomial profile as long as the adiabatic criterion is satisfied. In one embodiment, the distance between the first tapered waveguide 1005 and the second tapered waveguide 1010 is less than a micron. For example, the first tapered waveguide 1005 and the second tapered waveguide 1010 may be separated by 100 nanometers or less. The separation distance may affect the efficiency with which an optical signal may transfer between the first tapered waveguide 1005 and the second tapered waveguide 1010, and thus, a structure may be designed such that the first tapered waveguide 1005 and the second tapered waveguide 1010 are as close as fabrication techniques allow.

FIG. 10B illustrates a top view of the first tapered waveguide 1005 and the second tapered waveguide 1010.

By at least partially overlapping the first tapered waveguide 1005 and the second tapered waveguide 1010, an optical signal may be transferred between waveguides in different layers in the semiconductor wafer. In one embodiment, the first tapered waveguide 1005 and the second tapered waveguide 1010 partially overlap where their respective ends begin to taper. The slope or change of the taper may depend on the material used for forming the first tapered waveguide 1005 and the second tapered waveguide 1010. In one embodiment, at the widest point, the first tapered waveguide 1005 and the second tapered waveguide 1010 may have a width that ranges from 200 nanometers to 2 microns. At the narrowest point, the first tapered waveguide 1005 and the second tapered waveguide 1010 may have a width from 100 nanometers to 200 nanometers. The length of the tapering portion may range from 10 microns to 50 microns—e.g., around 20 microns.

FIGS. 11A-11D are graphs illustrating coupling loss of etched and unetched side surfaces of a photonic chip, according to one or more embodiments. More specifically, the graphs illustrate experimental optical coupling performance of a multi-prong waveguide adapter of a photonic chip (e.g., as shown in FIGS. 9A-9E) with a single-mode optical fiber through an index-matching material, for the different types of side surfaces.

Figure 11A:
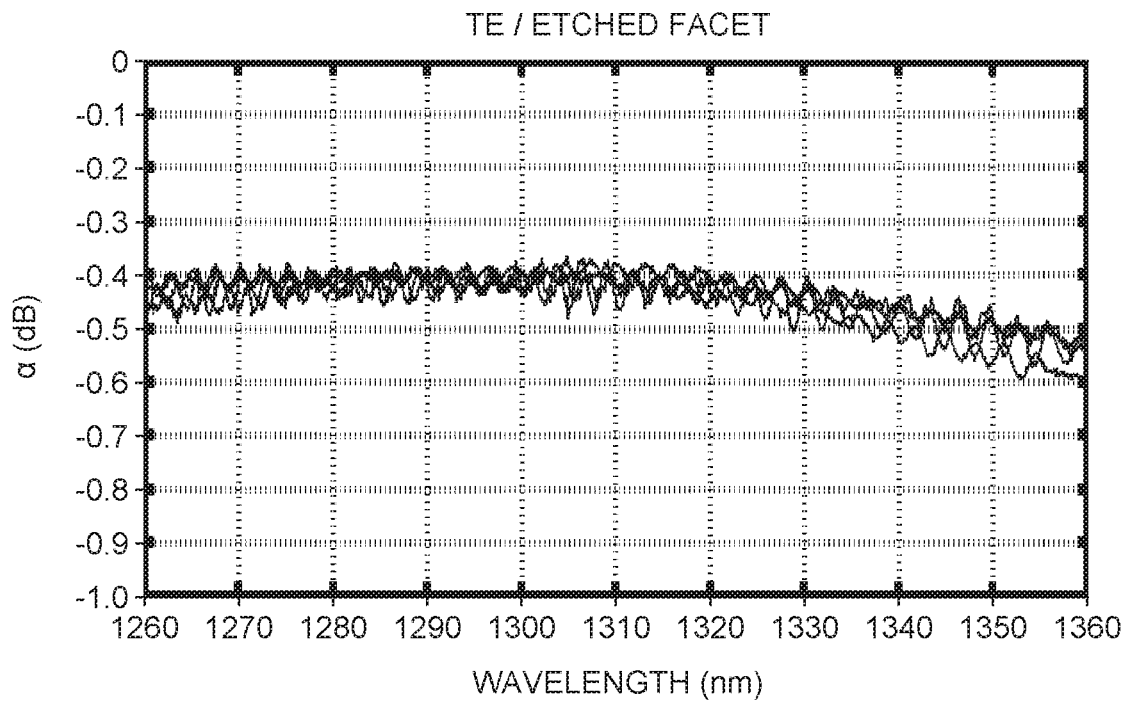
FIGS. 11A-11D are graphs illustrating coupling loss of etched and unetched side surfaces of a photonic chip, according to one or more embodiments.
Figure 11B:
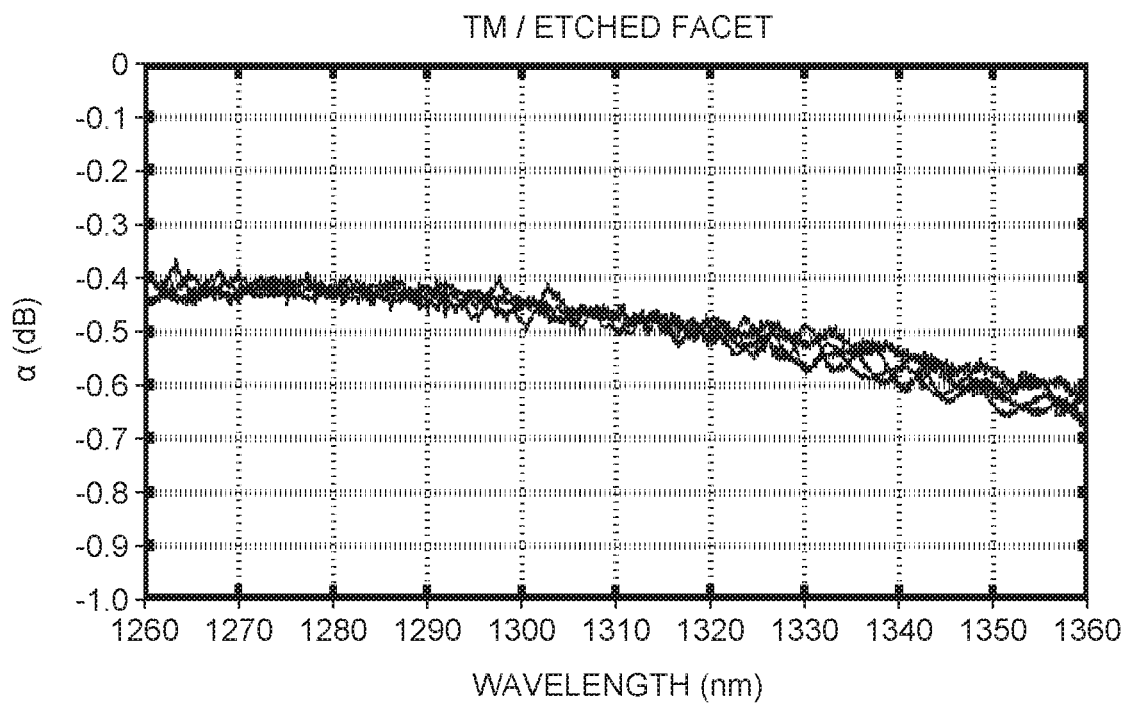

FIG. 11A is a graph representing a coupling loss for a transverse electric (TE) mode for a photonic chip having an etched side surface (e.g., having ILD etch and DRIE performed to create a mirror facet at the side surface). As shown, the coupling loss ranges from about a 0.4-0.45 dB loss at a 1260 nm wavelength to about a 0.5-0.6 dB loss at a 1360 nm wavelength. FIG. 11B is a graph representing a coupling loss for a transverse magnetic (TM) mode for the photonic chip having the etched side surface. As shown, the coupling loss ranges from about a 0.4-0.45 dB loss at the 1260 nm wavelength to about a 0.6-0.7 dB loss at the 1360 nm wavelength.

Figure 11C:
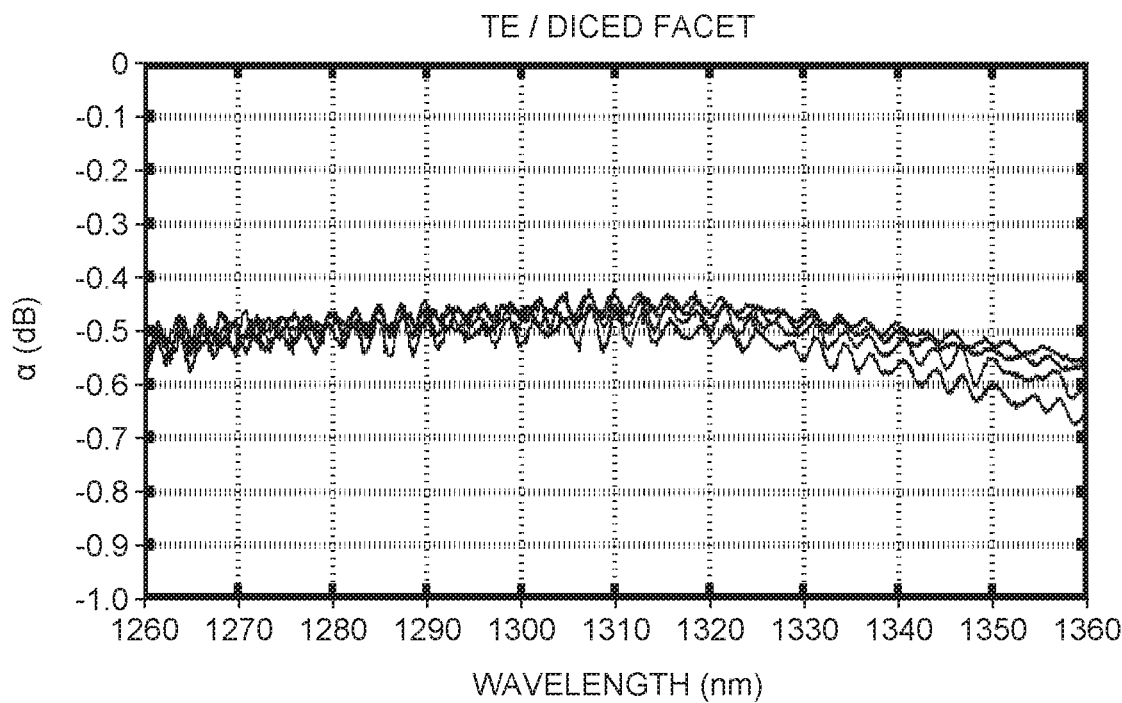
Figure 11D:
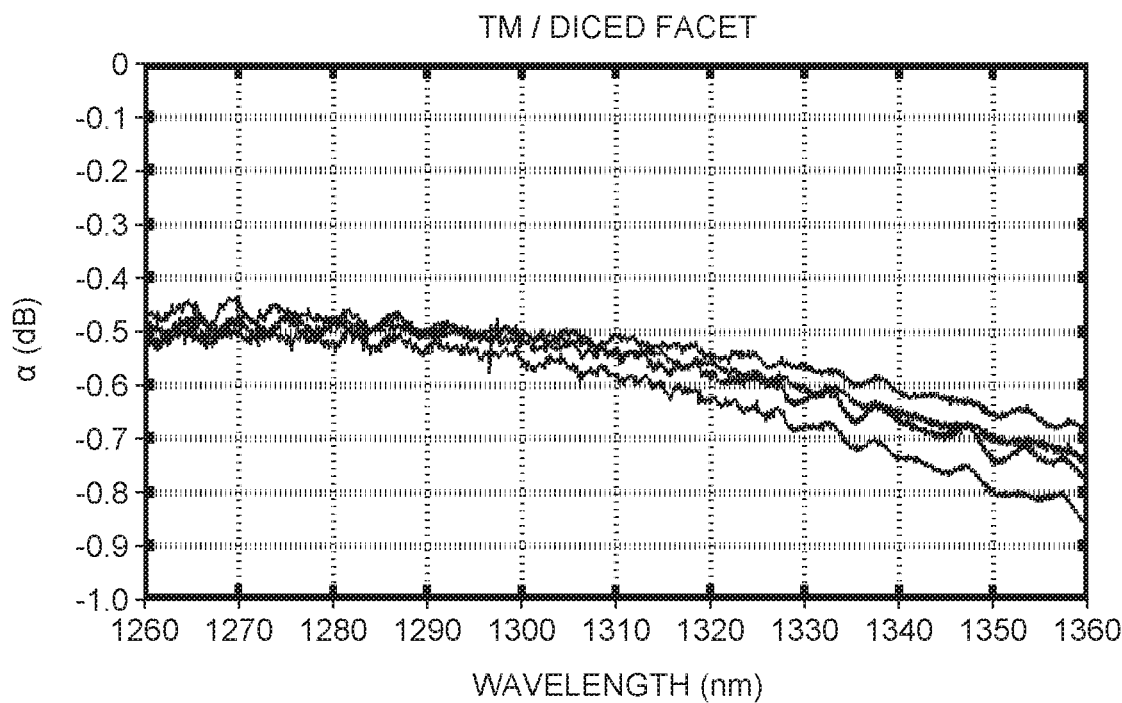

FIG. 11C is a graph representing a coupling loss for the TE mode for a photonic chip having an unetched side surface. In some embodiments, the photonic chip is diced using a high-volume mechanical dicing saw according to a standard CMOS dicing process. As shown, the coupling loss ranges from about a 0.5-0.55 dB loss at the 1260 nm wavelength to about a 0.55-0.65 dB loss at the 1360 nm wavelength. FIG. 11D is a graph representing a coupling loss for the TM mode for the photonic chip having the unetched side surface. As shown, the coupling loss ranges from about a 0.5 dB loss at the 1260 nm wavelength to about a 0.7-0.85 dB loss at the 1360 nm wavelength.

Thus, both the etched and unetched side surfaces demonstrate a peak optical coupling having a loss of 0.5 dB or better when butt-coupled to a flat-cleaved single mode optical fiber, with less than about a 0.3 dB variation over the entire 100 nm bandwidth of the O-band for both TE and TM modes, and with the unetched side surface resulting in a minimal (if any) coupling penalty when compared with the etched side surface. Stated another way, the plots illustrate that the coupling losses are low and similar for the etched and unetched side surfaces, suggesting that the process used to produce the unetched side surface (e.g., a dicing process) did not introduce significant excess loss.

FIGS. 11A-11D illustrate that a photonic chip using an edge coupler (e.g., including a multi-prong waveguide adapter) provides a suitable optical coupling efficiency for communicating an optical signal through an unetched side surface of the photonic chip. Beneficially, by using the edge coupler and/or an index-matching material to optically couple the edge coupler with the single-mode optical fiber (one example of an external light-carrying medium) through the unetched side surface, a low coupling loss may be achieved without requiring ILD etch and/or DRIE processes to be performed on the photonic chip. This significantly reduces fabrication costs and simplifies the supply chain, as the ILD etch and DRIE processes are non-standard CMOS processes that are not available in all foundries. Eliminating a need for the ILD etch and DRIE processes may further enable other integration schemes that might otherwise be difficult to achieve. For example, the edge coupler of the photonic chip may be directly butt-coupled with a fiber array unit (FAU) using an index-matching epoxy.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

I claim:

1. A method comprising:
providing a photonic chip comprising: an unetched side surface formed by a dicing process performed on a semiconductor wafer, and a first edge coupler that is optically exposed at the unetched side surface; and
optically aligning the photonic chip with an external light-carrying medium, wherein the first edge coupler is optically coupled with the external light-carrying medium through the unetched side surface.

2. The method of claim 1,
wherein the first edge coupler comprises a waveguide adapter optically coupled with an optical waveguide of the photonic chip, and
wherein the waveguide adapter is configured to transition an optical mode of an optical signal between a first, smaller mode size at the optical waveguide and a second, larger mode size that substantially matches a mode size of the external light-carrying medium.

3. The method of claim 2, wherein the waveguide adapter comprises at least one tapered waveguide configured to adjust a diameter of the optical mode of the optical signal.

4. The method of claim 2,
wherein the waveguide adapter comprises a multi-prong structure disposed on different layers, and
wherein each layer of the different layers is separated by a dielectric material.

5. The method of claim 1, further comprising:
applying an index-matching material between the unetched side surface and the external light-carrying medium,
wherein the first edge coupler is optically coupled with the external light-carrying medium through the index-matching material.

6. The method of claim 5, further comprising:
curing the index-matching material, wherein the photonic chip is fixedly attached to the external light-carrying medium.

7. The method of claim 1, wherein the dicing process comprises one or more of: mechanical sawing, scribing and cleaving, and laser cutting.

8. The method of claim 1, wherein the external light-carrying medium is one of: an optical waveguide of a second photonic chip, a second edge coupler of the second photonic chip, a laser, a light emitting diode, and an optical fiber.

9. An optical apparatus comprising:
a photonic chip comprising:
an unetched side surface formed by a dicing process performed on a semiconductor wafer; and
a first edge coupler that is optically exposed at the unetched side surface; and
an external light-carrying medium in a fixed arrangement with the photonic chip,
wherein the first edge coupler is optically coupled with the external light-carrying medium through the unetched side surface.

10. The optical apparatus of claim 9,
wherein the photonic chip further comprises an optical waveguide,
wherein the first edge coupler comprises a waveguide adapter optically coupled with the optical waveguide, and
wherein the waveguide adapter is operable to transition an optical mode of an optical signal between a first, smaller mode size at the optical waveguide and a second, larger mode size that substantially matches a mode size of the external light-carrying medium.

11. The optical apparatus of claim 10, wherein the waveguide adapter comprises at least one tapered waveguide configured to adjust a diameter of the optical mode of the optical signal.

12. The optical apparatus of claim 10,
wherein the waveguide adapter comprises a multi-prong structure disposed on different layers, and
wherein each layer of the different layers is separated by a dielectric material.

13. The optical apparatus of claim 9, wherein an index-matching material is applied between the unetched side surface and the external light-carrying medium, and
wherein the first edge coupler is optically coupled with the external light-carrying medium through the index-matching material.

14. The optical apparatus of claim 13, wherein the index-matching material is cured and fixedly attaches the photonic chip to the external light-carrying medium.

15. The optical apparatus of claim 9, wherein the external light-carrying medium is one of: an optical waveguide of a second photonic chip, a second edge coupler of the second photonic chip, a laser, a light emitting diode, and an optical fiber.

16. A method comprising:
performing a dicing process on a semiconductor wafer to produce a plurality of photonic chips, wherein each photonic chip of the plurality of photonic chips comprises a respective edge coupler that is optically exposed at a respective unetched side surface formed by the dicing process; and
optically aligning a first photonic chip of the plurality of photonic chips with an external light-carrying medium, wherein a first edge coupler of the first photonic chip is optically coupled with the external light-carrying medium through the respective unetched side surface.

17. The method of claim 16,
wherein the semiconductor wafer comprises a testing structure,
wherein the testing structure comprises a second edge coupler optically coupled with the first edge coupler, and
wherein performing the dicing process comprises separating the first photonic chip of the plurality of photonic chips from the testing structure.

18. The method of claim 16, further comprising:
applying an index-matching material between the unetched side surface of the first photonic chip and the external light-carrying medium,
wherein the first edge coupler is optically coupled with the external light-carrying medium through the index-matching material.

19. The method of claim 18, further comprising:
curing the index-matching material, wherein the first photonic chip is fixedly attached to the external light-carrying medium.

20. The method of claim 16, wherein the dicing process comprises one or more of: mechanical sawing, scribing and cleaving, and laser cutting.

* * * * *